United States Patent
Shima et al.

(10) Patent No.: US 9,117,958 B2
(45) Date of Patent: Aug. 25, 2015

(54) PHOTOELECTRIC CONVERSION DEVICE COMPRISING PHOTOELECTRIC CONVERSION ELEMENT

(75) Inventors: Yukinori Shima, Oyama (JP); Atsushi Hirose, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 678 days.

(21) Appl. No.: 13/162,699

(22) Filed: Jun. 17, 2011

(65) Prior Publication Data

US 2011/0315861 A1 Dec. 29, 2011

(30) Foreign Application Priority Data

Jun. 25, 2010 (JP) .................................. 2010-145401

(51) Int. Cl.
  *H01L 31/00* (2006.01)
  *H01L 31/105* (2006.01)
  *H01L 31/0216* (2014.01)
  *H01L 31/09* (2006.01)

(52) U.S. Cl.
  CPC ........ *H01L 31/105* (2013.01); *H01L 31/02162* (2013.01); *H01L 31/095* (2013.01); *H01L 31/1055* (2013.01)
  USPC .................. 250/214.1; 250/208.2; 250/214 R; 257/431; 257/435

(58) Field of Classification Search
  CPC ............. H01L 27/0629; H01L 27/0711; H01L 27/0727; H01L 27/0738; H01L 27/101; H01L 28/20; H01L 29/8605; H01L 51/05
  USPC ...... 250/208.1, 208.2, 214.1, 214 R, 214 DC; 257/431, 432, 433, 434, 435
  See application file for complete search history.

(56) References Cited

U.S. PATENT DOCUMENTS

| 4,172,221 | A  | * | 10/1979 | Iizuka ..................... 250/214 SW |
| 6,717,147 | B2 | * | 4/2004 | Oda ........................... 250/338.1 |
| 7,462,813 | B2 |   | 12/2008 | Hirose et al. |
| 7,485,838 | B2 |   | 2/2009 | Nishi et al. |

(Continued)

FOREIGN PATENT DOCUMENTS

| JP | 05-090557 A | 4/1993 |
| JP | 06-252425 A | 9/1994 |
| JP | 2008-182219 | 8/2008 |

*Primary Examiner* — Francis M Legasse, Jr.
(74) *Attorney, Agent, or Firm* — Eric J. Robinson; Robinson Intellectual Property Law Office, P.C.

(57) ABSTRACT

It is an object to provide a photoelectric conversion device whose power consumption and a mounting area are reduced and yield is improved and further to provide a photoelectric conversion device whose number of manufacturing processes and manufacturing cost are reduced. A photoelectric conversion device includes a photoelectric conversion element for outputting photocurrent corresponding to illuminance, and a resistor changing resistance corresponding to illuminance. In the photoelectric conversion device, one terminal of the photoelectric conversion element and one terminal of the resistor are electrically connected in series; the other terminal of the photoelectric conversion element is connected to a high power supply potential; the other terminal of the resistor is connected to a low power supply potential; and a light intensity adjusting unit is provided on a light reception surface side of the photoelectric conversion element or the resistor to adjust illuminance.

18 Claims, 7 Drawing Sheets

(56) References Cited

U.S. PATENT DOCUMENTS

| | | |
|---|---|---|
| 7,531,784 B2 | 5/2009 | Arao et al. |
| 7,667,272 B2 | 2/2010 | Hirose |
| 7,705,283 B2 | 4/2010 | Arao et al. |
| 7,791,012 B2 | 9/2010 | Hirose |
| 8,106,346 B2 | 1/2012 | Hirose et al. |
| 2007/0114361 A1* | 5/2007 | Kunst et al. .................... 250/205 |
| 2008/0099664 A1* | 5/2008 | Yamazaki et al. ......... 250/214 A |
| 2008/0158137 A1* | 7/2008 | Yoshida ........................ 345/102 |

* cited by examiner

PHOTOELECTRIC CONVERSION DEVICE COMPRISING PHOTOELECTRIC CONVERSION ELEMENT

BACKGROUND OF THE INVENTION

1. Field of the Invention

The present invention relates to photoelectric conversion devices.

2. Description of the Related Art

A number of photoelectric conversion devices used for detecting an electromagnetic wave are generally known, and for example, photoelectric conversion devices having sensitivity from ultra violet rays to infrared rays are collectively referred to as optical sensors. An optical sensor having sensitivity to light in a visible light region with a wavelength of 400 nm to 700 nm is particularly referred to as a visible light sensor, and a large number of visible light sensors are used for devices which require illuminance adjustment, on or off control, or the like depending on human living environment.

In some display devices, ambient brightness of the display device is detected to adjust display luminance. This is because with optical sensors, visibility can be improved or wasted power consumption can be reduced by detecting ambient brightness and obtaining appropriate display luminance. For example, as display devices which include optical sensors for adjusting luminance, mobile phones and computers can be given. In addition, as well as the ambient brightness of a display portion, luminance of the backlight of a display device, in particular, a liquid crystal display device is detected by an optical sensor to adjust luminance of a display screen.

When weak light to strong light are detected in an optical sensor, the range of photocurrent is expanded; therefore, output voltage increases linearly proportional to illuminance in the case where the photocurrent is converted into voltage. Accordingly, when output voltage is obtained in a wide illuminance range, several millivolts are obtained in the case of weak light, and several volts are obtained in the case of strong light. Thus, due to limitations on a circuit (e.g., power supply voltage), it is difficult to broaden the dynamic range of illuminance as an optical sensor. Patent Document 1 discloses an optical sensor in which a wider range of illuminance can be detected without expansion of the range of output voltage or output current.

A logarithmic output illuminance sensor which can obtain output voltage proportional to a logarithmic value of illuminance has been developed because power consumption can be reduced. In addition, spectral sensitivity characteristics required for the illuminance sensor are necessary to be made closer to the eye-spectral sensitivity. Thus, a photodiode and the like mounted on such an illuminance sensor are often formed with a material which has low sensitivity in regions other than a visible light region.

REFERENCE

[Patent Document 1] Japanese Published Patent Application No. 2008-182219

SUMMARY OF THE INVENTION

A photoelectric conversion device which can obtain output voltage proportional to a logarithmic value of illuminance and includes a plurality of transistors, a load resistor, an operational amplifier, and the like in combination requires a complicated circuit configuration. Further, a control circuit for controlling a resistance value of a variable resistor needs to be provided additionally in the photoelectric conversion device disclosed in Patent Document 1; therefore, it is necessary to control a diode element and the variable resistor independently.

In view of the above problems, it is an object of one embodiment of the present invention to provide a photoelectric conversion device whose power consumption and a mounting area are reduced and yield is improved. Further, it is another object of one embodiment of the present invention to provide a photoelectric conversion device whose number of manufacturing processes and manufacturing cost are reduced. Furthermore, it is another object of one embodiment of the present invention to provide a photoelectric conversion device having high detection accuracy, which can control output voltage in a given way by adjusting illuminance.

According to one embodiment of the present invention, a photoelectric conversion device includes a photoelectric conversion element for outputting photocurrent corresponding to illuminance, and a resistor changing resistance corresponding to illuminance. In the photoelectric conversion device, one terminal of the photoelectric conversion element and one terminal of the resistor are electrically connected so that the photoelectric conversion element and the resistor electrically connected in series.

In the embodiment of the present invention, a light intensity adjusting unit may be provided on a light reception surface side of the photoelectric conversion element or the resistor.

In the embodiment of the present invention, the other terminal of the photoelectric conversion element may be electrically connected to a wiring for supplying a high power supply potential.

In the embodiment of the present invention, the other terminal of the resistor may be electrically connected to a wiring for supplying a low power supply potential.

In the embodiment of the present invention, the one terminal of the photoelectric conversion element and the one terminal of the resistor may be electrically connected to an output voltage terminal.

In the embodiment of the present invention, a semiconductor film is used for the resistor. As the semiconductor film, a polycrystalline semiconductor film or an amorphous semiconductor film can be used. As a semiconductor material of the polycrystalline semiconductor film or the amorphous semiconductor film, silicon can be used.

In the embodiment of the present invention, the photoelectric conversion element may be a photodiode.

In the embodiment of the present invention, the photodiode may be a PIN photodiode. A PIN photodiode is a photodiode having a junction structure in which an i-type semiconductor layer is interposed between a p-type semiconductor layer and an n-type semiconductor layer. Note that an "i-type semiconductor" refers to not only a so-called intrinsic semiconductor in which the Fermi level lies in the middle of the band gap, but a substantially intrinsic semiconductor in which the concentration of an impurity imparting p-type or n-type conductivity is $1 \times 10^{20}$ cm$^{-3}$ or lower and photoconductivity is 100 times or more as high as the dark conductivity.

In the embodiment of the present invention, the photoelectric conversion element may be a phototransistor.

According to one embodiment of the present invention, a photoelectric conversion device whose power consumption and a mounting area are reduced and yield is improved can be obtained. Further, a photoelectric conversion device whose number of manufacturing processes and manufacturing cost are reduced can be obtained. Furthermore, a photoelectric conversion device having high detection accuracy, which can control output voltage in a given way by adjusting illuminance, can be obtained.

DETAILED DESCRIPTION OF THE INVENTION

Figure 1:
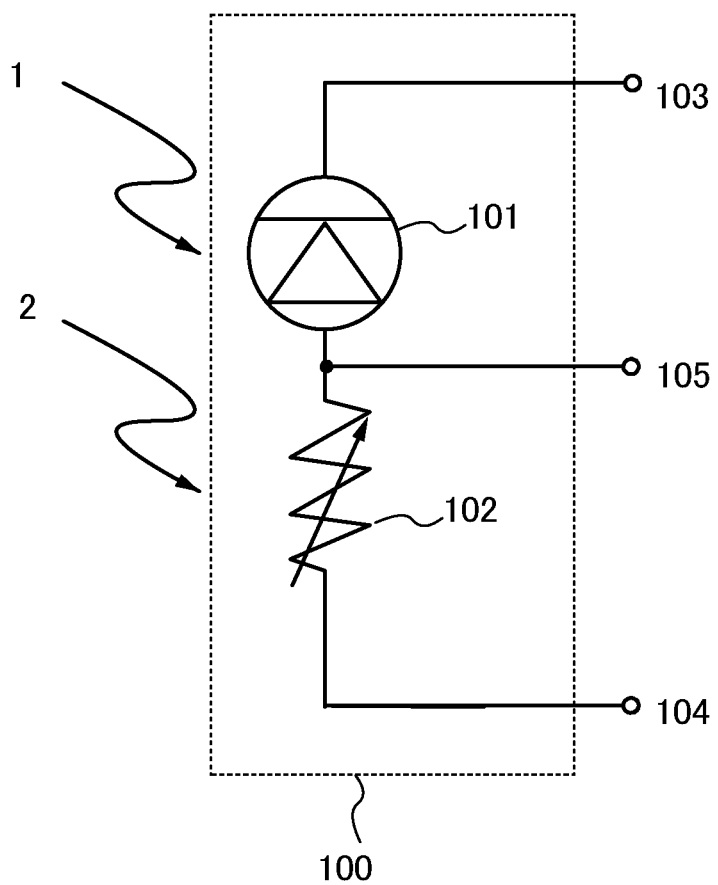
FIG. 1 is a diagram illustrating a photoelectric conversion device of the present invention.

Hereinafter, embodiments of the present invention will be described with reference to the drawings. Note that the present invention can be implemented in various different ways and it will be readily appreciated by those skilled in the art that modes and details of the present invention can be changed in various ways without departing from the spirit and scope of the present invention. Therefore, the present invention should not be construed as being limited to the following description of the embodiments. Note that in all the drawings for illustrating the embodiments, the same portions or portions having similar functions are denoted by the same reference numerals, and description thereof is not repeated.

In this embodiment, a structure and an operation of a photoelectric conversion device will be described. Note that a photoelectric conversion device described in this embodiment can obtain output voltage proportional to a logarithmic value of illuminance by combining a photoelectric conversion element for outputting photocurrent corresponding to illuminance and a resistor changing resistance corresponding to illuminance.

The structure of the photoelectric conversion device of this embodiment is described with reference to FIG. 1. A photoelectric conversion device 100 of this embodiment includes a photoelectric conversion element 101 and a resistor 102.

In the photoelectric conversion device 100, a high power supply potential (Vdd) is supplied to a high voltage source terminal 103 and a low power supply potential (Vss) is supplied to a low voltage source terminal 104, as illustrated in FIG. 1. Further, an output voltage (Vout) can be obtained from an output voltage terminal 105.

As the photoelectric conversion element 101, a PN or PIN photodiode, a phototransistor, or the like can be used. A PIN photodiode is preferable because the response characteristics of a depletion layer to light irradiation are better as compared to those of a PN photodiode.

As a semiconductor material of the photoelectric conversion element 101, Si, Ge, GaAs, or the like can be used. The semiconductor material may be selected in consideration of a wavelength range of light to be detected. For example, it is preferable to use a semiconductor material which has a photoelectric effect in a visible light range, typically a material whose band gap energy is greater than or equal to 0.8 eV and less than or equal to 2.0 eV so that light in a visible light range can be detected.

As a material of the resistor 102, Si, CdS, CdSe, CdS.Se, PbS, or the like can be used. It is preferable to use a semiconductor material which has a photoelectric effect in a visible light range, typically a material whose band gap energy is greater than or equal to 0.8 eV and less than or equal to 2.0 eV.

The photoelectric conversion device 100 having high detection accuracy, in which spectral sensitivity is much closer to the eye-spectral sensitivity, can be obtained by using the semiconductor material which has a photoelectric effect in a visible light range not only for the photoelectric conversion element 101 but also the resistor 102.

Next, the specific circuit configuration of the photoelectric conversion device 100 illustrated in FIG. 1 is described. In the photoelectric conversion device 100 illustrated in FIG. 1, one terminal of the photoelectric conversion element 101 and one terminal of the resistor 102 are electrically connected to the output voltage terminal 105; the other terminal of the photoelectric conversion element 101 is electrically connected to the high voltage source terminal 103; and the other terminal of the resistor 102 is electrically connected to the low voltage source terminal 104.

Note that in this specification, the description that "A and B are electrically connected to each other" includes that an object having any electrical function exists between A and B.

Next, the operation of the photoelectric conversion device 100 illustrated in FIG. 1 is briefly described. The high power supply potential (Vdd) is supplied to the high voltage source terminal 103 and the low power supply potential (Vss) is supplied to the low voltage source terminal 104. Photocurrent is generated when the photoelectric conversion element 101 is irradiated with incident light 1. The generated photocurrent flows through the resistor 102. The resistance value of the resistor 102 is determined by irradiation of the resistor 102 with incident light 2. Voltage is generated on both ends of the resistor 102 in accordance with Ohm's law and can be obtained as the output voltage (Vout) from the output voltage terminal 105.

Thus, the photoelectric conversion device 100 can expand the range of illuminance that can be detected by adjusting the illuminance of the incident light 1 and the illuminance of the incident light 2 illustrated in FIG. 1, and the output voltage in accordance with the illuminance range can be taken out in a given way.

Here, given is a brief description of a relation between a resistance value of the resistor 102 and a range and accuracy of the range of illuminance that can be detected in the photoelectric conversion device 100 in which the photoelectric conversion element 101 and the resistor 102 are electrically connected in series.

The smaller the resistance value of the resistor 102 is, the lower the level of the voltage generated in the resistor 102 is. Therefore, the range of illuminance that can be detected in the photoelectric conversion device 100 is expanded. Further, the larger the resistance value of the resistor 102 is, the more sensitive the change in the output voltage (Vout) is. Therefore, accuracy of illuminance that can be detected in the photoelectric conversion device 100 is improved.

Regarding adjustment of the illuminance of the incident light 2 in the photoelectric conversion device 100 in which the photoelectric conversion element 101 and the resistor 102 are electrically connected in series, it is important to determine illuminance having an optimal resistance value by considering which of the above, i.e. expanding the illuminance range or improving accuracy of illuminance that can be detected is prioritized.

Output voltage (Vout) proportional to a logarithmic value of illuminance can be obtained by combining the photoelectric conversion element 101 and the resistor 102, and the description is made below with reference to FIG. 2, FIG. 3, and FIG. 4.

Figure 2:
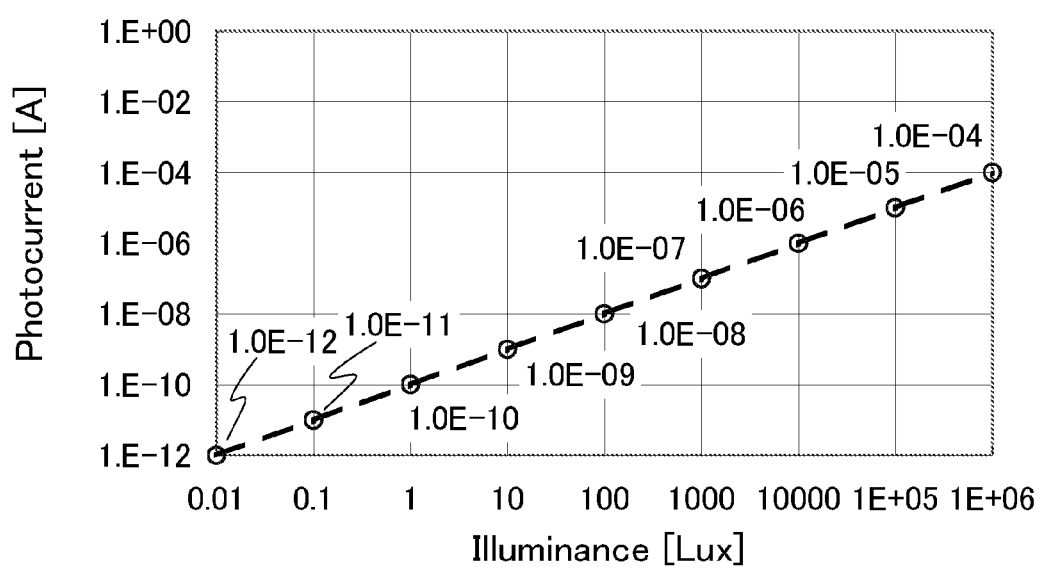
FIG. 2 is a graph showing illuminance dependence of output current in a photoelectric conversion element of a photoelectric conversion device of the present invention.
Figure 3:
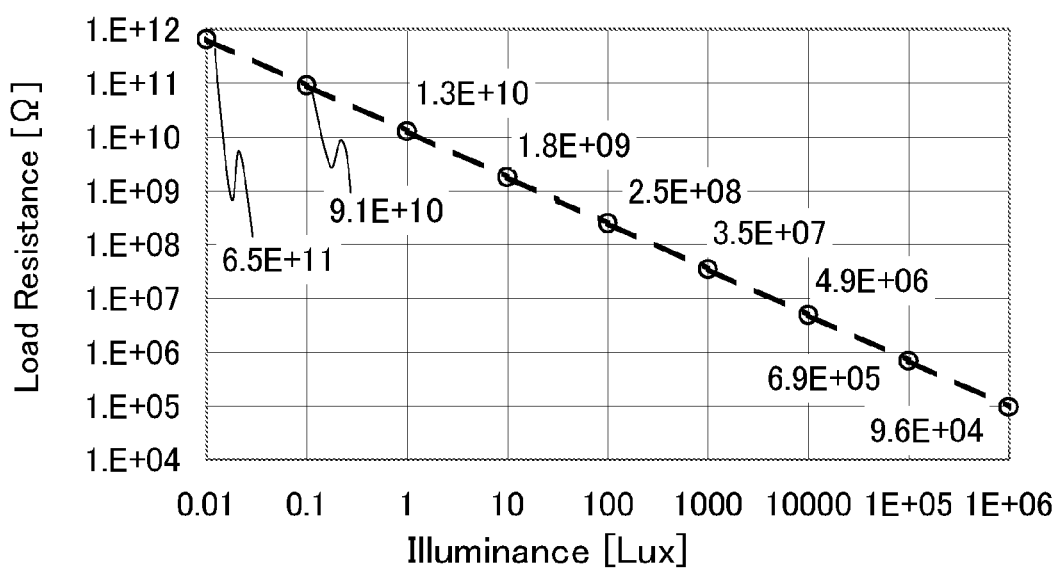
FIG. 3 is a graph showing illuminance dependence of load resistance of a resistor in a photoelectric conversion device of the present invention.
Figure 4:
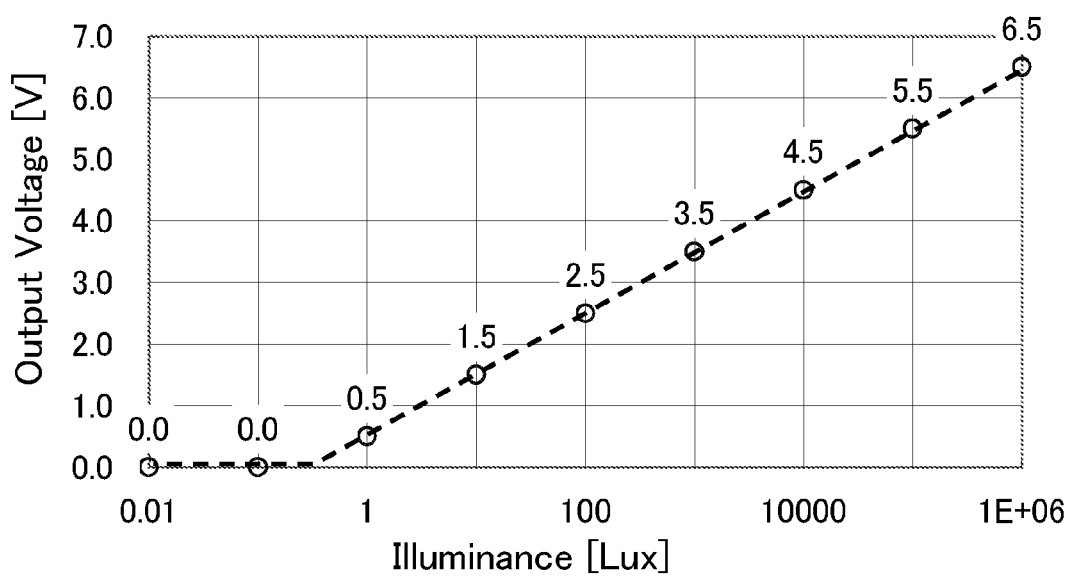
FIG. 4 is a graph showing illuminance dependence of output voltage of a photoelectric conversion device of the present invention.

Note that FIG. 2, FIG. 3, and FIG. 4 illustrate the case where amorphous silicon is used as semiconductor materials of the photoelectric conversion element 101 and the resistor 102. When a semiconductor material which has a photoelectric effect in a visible light range, such as amorphous silicon, is used for the photoelectric conversion element and the resistor, detection accuracy in the visible light range in the photoelectric conversion device can be further improved.

FIG. 2 shows actual measurement values of illuminance-photocurrent characteristics in the case where an amorphous silicon photodiode is used as the photoelectric conversion element 101. FIG. 2 shows that the larger the illuminance is, the greater the value of photocurrent is in a light source used for the measurement. That is, it can be confirmed that the value of photocurrent of the photoelectric conversion element can be adjusted by illuminance.

Note that the photocurrent value can be adjusted as appropriate by changing the light reception area of the photodiode.

FIG. 3 shows actual measurement values of illuminance-load resistance characteristics in the case where an amorphous silicon variable resistor is used as the resistor 102. FIG. 3 shows that the larger the illuminance is, the greater the value of load resistance is in a light source used for the measurement. That is, it can be confirmed that the resistance value of the resistor can be adjusted by illuminance.

Note that the resistance value can be adjusted as appropriate by changing the length and width of the resistor 102.

FIG. 4 shows calculation results of illuminance-output voltage characteristics of the photoelectric conversion device 100 illustrated in FIG. 1, which includes the photoelectric conversion element 101 used in FIG. 2 and the resistor 102 used in FIG. 3.

FIG. 4 shows that output voltage (Vout) proportional to a logarithmic value of illuminance can be obtained.

Thus, a photoelectric conversion device that can obtain output voltage proportional to a logarithmic value of illuminance can be formed by combining two elements: the photoelectric conversion element 101 in which the value of photocurrent with respect to illuminance is increased; and the resistor 102 in which the resistance value with respect to illuminance is reduced.

Further, output voltage can be controlled in a given way by adjusting illuminance, i.e. adjusting the value of photocurrent in the photoelectric conversion element 101 with the incident light 1 and the resistance value of the resistor 102 with the incident light 2. Parameters of two elements can be easily controlled, whereby output voltage in accordance with required specs can be taken out easily.

In such a manner, since the photoelectric conversion device that can obtain output voltage proportional to a logarithmic value of illuminance can be formed with the two elements, power consumption and a mounting area can be reduced and yield can be improved. Further, since the photoelectric conversion element and the resistor which are included in the photoelectric conversion device can be formed over one substrate with the same material, the number of manufacturing processes and manufacturing cost can be reduced. Furthermore, in the photoelectric conversion device, output voltage can be taken out in a given way in a wide illuminance range and detection accuracy of illuminance can be improved particularly in a visible light range.

A photoelectric conversion device having the above-described structure is one embodiment of the present invention, and a photoelectric conversion device the structure of which is different from the above-described structure in some points is included in the present invention.

Different structures of the photoelectric conversion device are described with reference to FIGS. 5A and 5B. A photoelectric conversion device 200 includes the photoelectric conversion element 101, the resistor 102, and a light intensity adjusting unit 106.

Figure 5A:
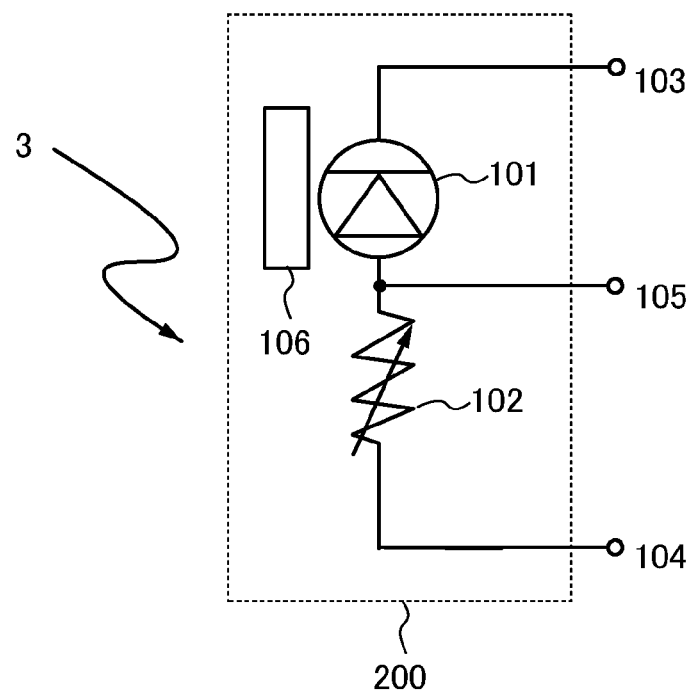
FIGS. 5A and 5B are diagrams each illustrating a photoelectric conversion device of the present invention.
Figure 5B:
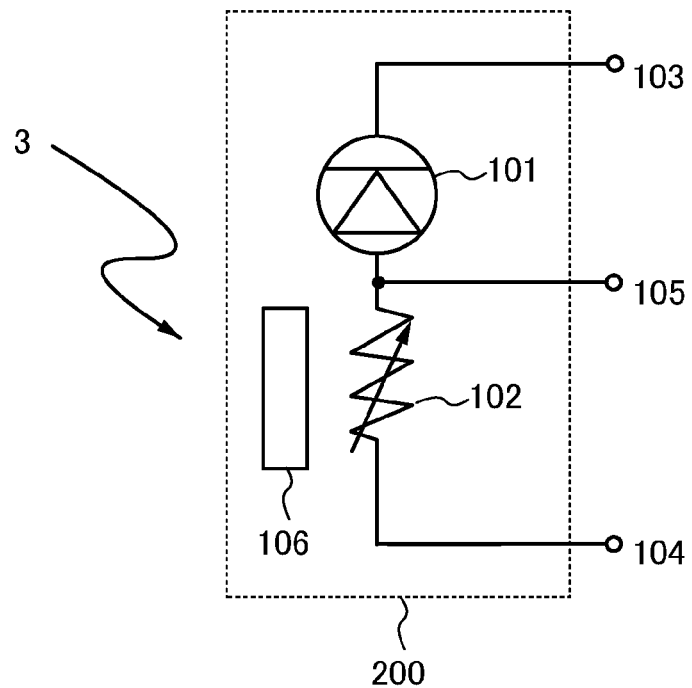

In the photoelectric conversion device 200, a high power supply potential (Vdd) is supplied to the high voltage source terminal 103 and a low power supply potential (Vss) is supplied to the low voltage source terminal 104, as illustrated in FIGS. 5A and 5B. Further, an output voltage (Vout) can be obtained from the output voltage terminal 105.

The light intensity adjusting unit 106 can adjust illuminance of light incident on the photoelectric conversion element 101 or illuminance of light incident on the resistor 102. As the light intensity adjusting unit 106, an optical filter such as a dimming filter, a color glass filter, or an interference filter can be used. Further, as the light intensity adjusting unit 106, a semiconductor film which is an optical absorber can be used.

The light intensity adjusting unit 106 may be provided on the light reception surface side of the photoelectric conversion element 101 as illustrated in FIG. 5A or on the light reception surface side of the resistor 102 as illustrated in FIG. 5B.

Next, the operation of the photoelectric conversion device 200 illustrated in FIG. 5A is briefly described. The high power supply potential (Vdd) is supplied to the high voltage source terminal 103 and the low power supply potential (Vss) is supplied to the low voltage source terminal 104.

In FIG. 5A, the illuminance of light incident on the photoelectric conversion element 101 is equivalent to illuminance adjusted by the light intensity adjusting unit 106, and the illuminance of light incident on the resistor 102 is equivalent to illuminance of light incident on the photoelectric conversion device 200.

When the photoelectric conversion device 200 is irradiated with incident light 3, photocurrent corresponding to the illuminance adjusted by the light intensity adjusting unit 106 is generated in the photoelectric conversion element 101. The generated photocurrent flows through the resistor 102. The resistance value of the resistor 102 is determined in accordance with the illuminance of light incident on the photoelectric conversion device 200. Voltage is generated on both ends of the resistor 102 in accordance with Ohm's law and can be obtained as the output voltage (Vout) from the output voltage terminal 105.

Next, the operation of the photoelectric conversion device 200 illustrated in FIG. 5B is briefly described. The high power supply potential (Vdd) is supplied to the high voltage source terminal 103 and the low power supply potential (Vss) is supplied to the low voltage source terminal 104.

In FIG. 5B, the illuminance of light incident on the photoelectric conversion element 101 is equivalent to illuminance of the light incident on the photoelectric conversion device 200, and the illuminance of light incident on the resistor 102 is equivalent to the illuminance adjusted by the light intensity adjusting unit 106.

Photocurrent is generated in the photoelectric conversion element 101 when the photoelectric conversion device 200 is irradiated with the incident light 3. The generated photocurrent flows through the resistor 102. The resistance value of the resistor 102 is determined in accordance with the illuminance adjusted by the light intensity adjusting unit 106. Voltage is generated on both ends of the resistor 102 in accordance with Ohm's law and can be obtained as the output voltage (Vout) from the output voltage terminal 105.

In the case where the illuminance of light incident on the photoelectric conversion element 101 and the illuminance of light incident on the resistor 102 are desired to be changed in the photoelectric conversion device 100, the range of illuminance that can be detected can be expanded by adjusting the illuminance of the incident light 1 and the illuminance of the incident light 2 and output voltage within the illuminance range can be taken out in a given way.

In the case where the illuminance of light incident on the photoelectric conversion element 101 and the illuminance of light incident on the resistor 102 are desired to be changed in the photoelectric conversion device 200, the range of illuminance that can be detected can be expanded by adjusting the illuminance of the incident light 3 and using the light intensity adjusting unit 106 illustrated in FIGS. 5A and 5B and output voltage within the illuminance range can be taken out in a given way.

Thus, a photoelectric conversion device having high detection accuracy, which can control output voltage in a given way by adjusting illuminance, can be obtained.

Figure 6A:
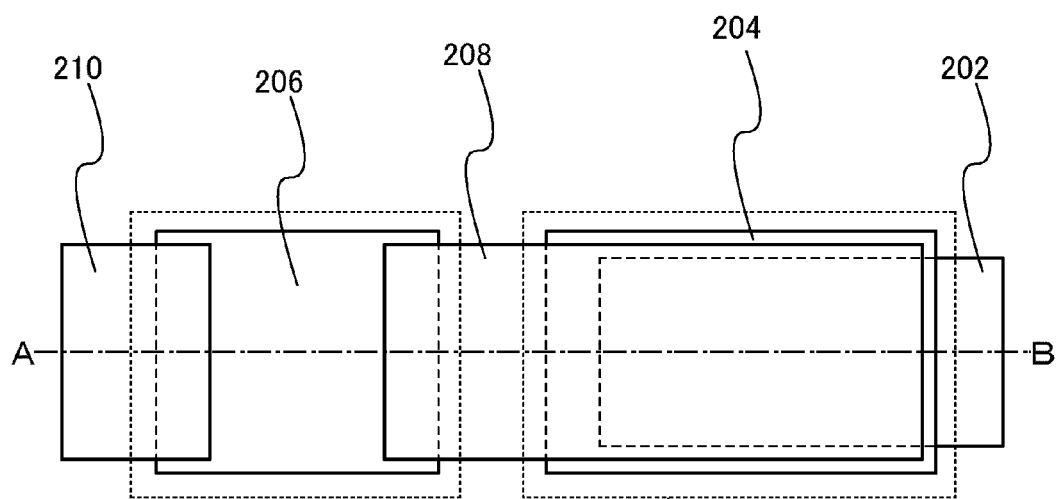
FIGS. 6A and 6B illustrate a photoelectric conversion device of the present invention.
Figure 6B:
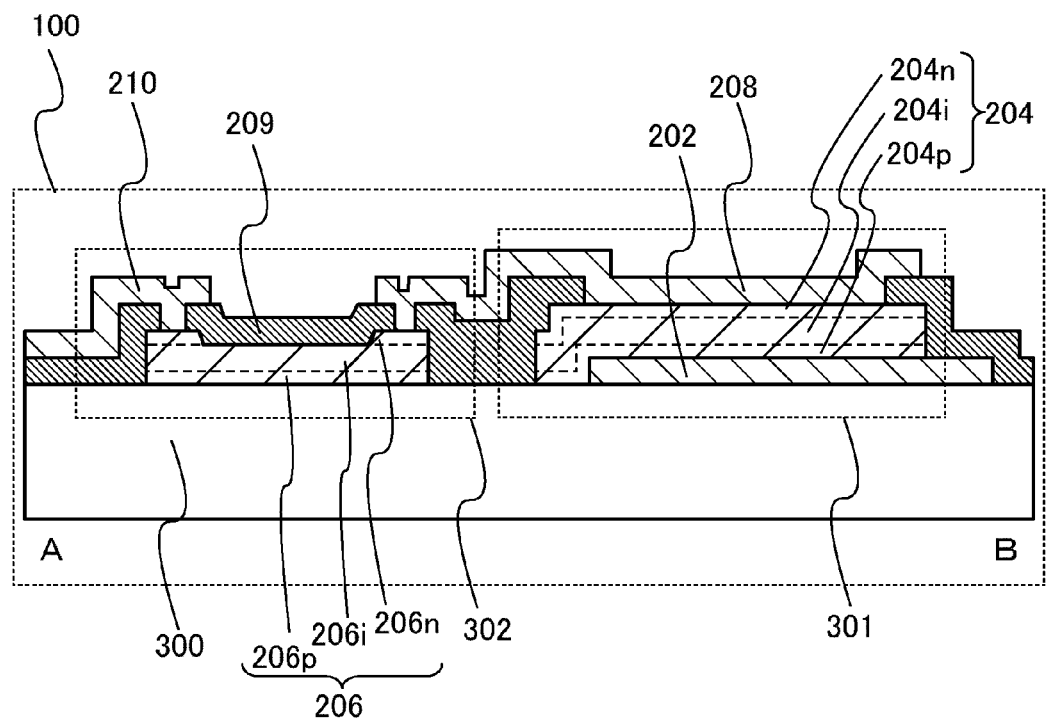

FIGS. 6A and 6B is a structure example of the above photoelectric conversion device 100.

FIGS. 6A and 6B is a structure example of the photoelectric conversion device 100 in FIG. 1, in which a photodiode 301 including amorphous silicon is used as the photoelectric conversion element 101 and a variable resistor 302 including amorphous silicon is used as the resistor 102. FIG. 6A is a top view of the photoelectric conversion device. FIG. 6B is a cross-sectional view taken along dashed line A-B in FIG. 6A.

The photodiode 301 and the variable resistor 302 are formed over one substrate 300. The photoelectric conversion device 100 includes, over the substrate 300, a first electrode layer 202, a second electrode layer 208, a third electrode layer 210, a photoelectric conversion layer 204, a semiconductor layer 206, and an insulating layer 209.

The photoelectric conversion layer 204 includes a p-type semiconductor layer 204p, an n-type semiconductor layer 204n, and an intrinsic (i-type) semiconductor layer 204i interposed between the p-type semiconductor layer 204p and the n-type semiconductor layer 204n. Note that the photoelectric conversion layer 204 is not limited to this structure, and it is only necessary to have a stacked-layer structure of a p-type semiconductor layer and an n-type semiconductor layer.

The semiconductor layer 206 includes a p-type semiconductor layer 206p, an n-type semiconductor layer 206n, and an intrinsic (i-type) semiconductor layer 206i interposed between the p-type semiconductor layer 206p and the n-type semiconductor layer 206n. Note that the semiconductor layer 206 is not limited to this structure, and it is only necessary to have a stacked-layer structure of a p-type semiconductor layer and an n-type semiconductor layer.

The first electrode layer 202 is formed over the substrate 300, and is in contact with and electrically connected to the photoelectric conversion layer 204. The photoelectric conversion layer 204 covers the first electrode layer 202 and part of the photoelectric conversion layer 204 is in contact with the substrate 300. The semiconductor layer 206 which has a photoelectric effect in a visible light range is formed in contact with the substrate 300. The insulating layer 209 covers the following portions: one end portion of the photoelectric conversion layer 204; the other end portion of the photoelectric conversion layer 204; one end portion of the semiconductor layer 206; the other end portion of the semiconductor layer 206; and part of the semiconductor layer 206. The insulating layer 209 is formed between the photoelectric conversion layer 204 and the semiconductor layer 206, whereby occurrence of defects such as short circuit of the following caused by the second electrode layer 208 can be prevented: the p-type semiconductor layer 204p; the intrinsic (i-type) semiconductor layer 204i; the p-type semiconductor layer 206p; and the intrinsic (i-type) semiconductor layer 206i. The second electrode layer 208 covers the insulating layer 209, and is in contact with and electrically connected to the photoelectric conversion layer 204 and the one end portion of the semiconductor layer 206. The third electrode layer 210 covers the insulating layer 209, and is in contact with and electrically connected to the other end portion of the semiconductor layer 206.

The photoelectric conversion layer 204 and the semiconductor layer 206 are formed in the same film formation process.

The second electrode layer 208 and the third electrode layer 210 are formed in the same film formation process.

As materials of the first electrode layer 202, the second electrode layer 208, and the third electrode layer 210, conductive materials having a light-transmitting properties can be used.

The conductive material having a light-transmitting property refers to a conductive material having a visible light transmittance of greater than or equal to 75% and less than or equal to 100%.

As the materials of the first electrode layer 202, the second electrode layer 208, and the third electrode layer 210, metal materials such as Mo, Ti, Ta, W, Al, Cu, or Nd can be used.

As a material of the insulating layer 209, an oxide film material or a nitride film material, such as $SiO_2$, SiON, SiN, or SiNO, can be used. The insulating layer 209 may have a stacked-layer structure.

Note that in the case where a metal material is used for the first electrode layer 202 in order to detect illuminance accurately, it is preferable that a conductive material having a light-transmitting property be used for the second electrode layer 208 and the third electrode layer 210. In the case where a metal material is used for the second electrode layer 208 and the third electrode layer 210, it is preferable that a conductive material having a light-transmitting property be used for the first electrode layer 202. In the case where a metal material is used for the first electrode layer 202, the second electrode layer 208, and the third electrode layer 210, the smaller the electrode layer areas are made, the more light enters the photoelectric conversion layer 204 and the semiconductor layer 206.

Figure 7A:
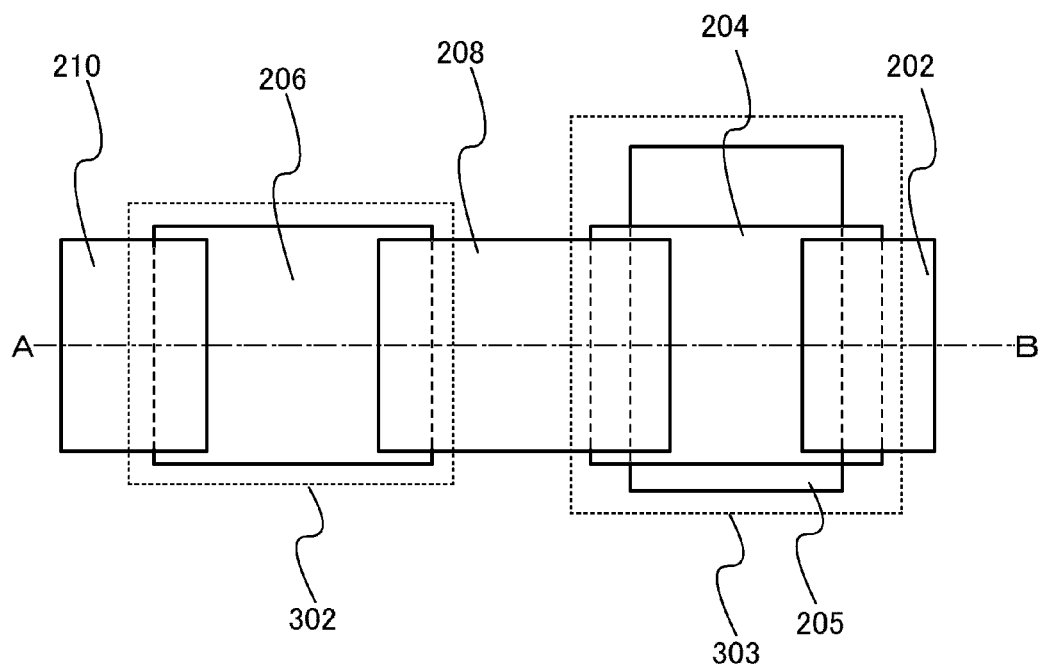
FIGS. 7A and 7B illustrate a photoelectric conversion device of the present invention.
Figure 7B:
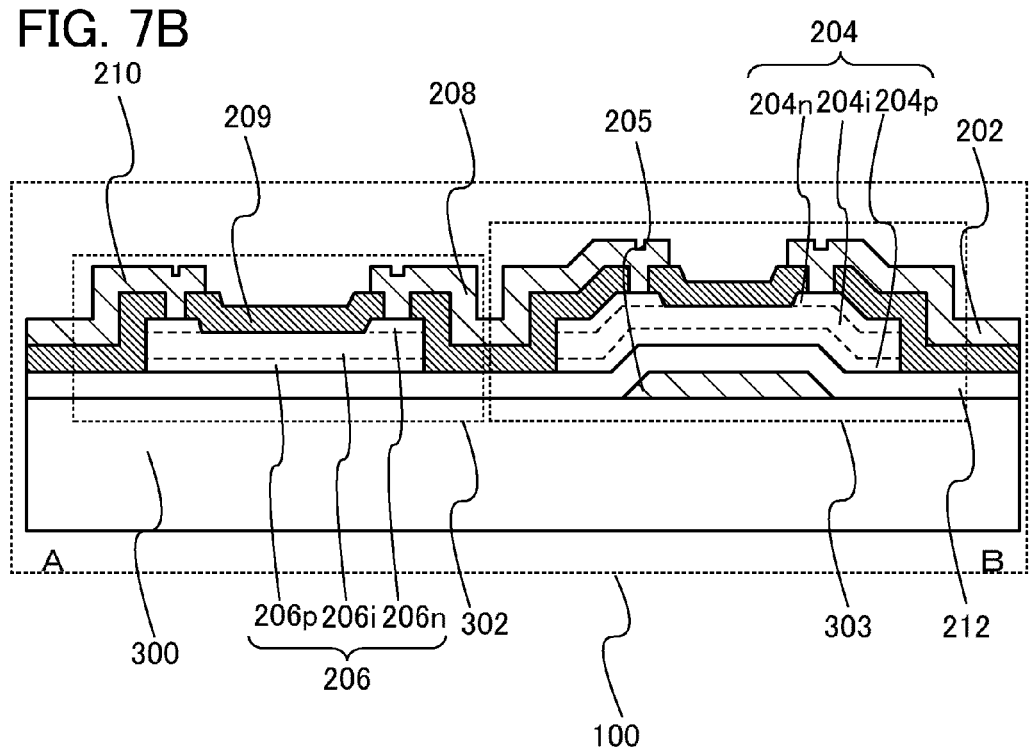

FIGS. 7A and 7B is a structure example of the above photoelectric conversion device 100.

FIGS. 7A and 7B is a structure example of the photoelectric conversion device 100 in FIG. 1, in which a phototransistor 303 including amorphous silicon is used as the photoelectric conversion element 101 and the variable resistor 302 including amorphous silicon is used as the resistor 102. FIG. 7A is a top view of the photoelectric conversion device. FIG. 7B is a cross-sectional view taken along dashed line A-B in FIG. 7A.

The phototransistor 303 and the variable resistor 302 are formed over one substrate 300. The photoelectric conversion device 100 includes, over the substrate 300, the first electrode layer 202, the second electrode layer 208, the third electrode layer 210, the photoelectric conversion layer 204, the semiconductor layer 206, a gate electrode layer 205, a gate insulating layer 212, and the insulating layer 209. The gate electrode layer 205 is formed over the substrate 300, and the gate insulating layer 212 is formed so as to cover the gate electrode layer 205. The photoelectric conversion layer 204 is formed so as to overlap with the gate electrode layer 205 with the gate insulating layer 212 interposed therebetween. The semiconductor layer 206 which has a photoelectric effect in a visible light range is formed in contact with the gate insulating layer 212. The insulating layer 209 covers the following portions: one end portion of the photoelectric conversion layer 204; part of the photoelectric conversion layer 204; the other end portion of the photoelectric conversion layer 204; one end portion of the semiconductor layer 206; the other end portion of the semiconductor layer 206; and part of the semiconductor layer 206. The insulating layer 209 is formed between the photoelectric conversion layer 204 and the semiconductor layer 206, whereby occurrence of defects such as short circuit of the following caused by the second electrode layer 208 can be prevented: the p-type semiconductor layer 204$p$; the intrinsic (i-type) semiconductor layer 204$i$; the p-type semiconductor layer 206$p$; and the intrinsic (i-type) semiconductor layer 206$i$. The second electrode layer 208 covers the insulating layer 209, and is in contact with and electrically connected to the one portion of the photoelectric conversion layer 204 and the one end portion of the semiconductor layer 206. The first electrode layer 202 covers the insulating layer 209, and is in contact with and electrically connected to the other end portion of the photoelectric conversion layer 204, so that a channel region is formed between the first electrode layer 202 and the second electrode layer 208. The third electrode layer 210 covers the insulating layer 209, and is in contact with and electrically connected to the other end portion of the semiconductor layer 206.

Note that the first electrode layer 202 functions as one of a source electrode layer and a drain electrode layer, and the second electrode layer 208 functions as the other of the source electrode layer and the drain electrode layer.

The photoelectric conversion layer 204 and the semiconductor layer 206 are formed in the same film formation process.

As illustrated in FIGS. 6A and 6B and FIGS. 7A and 7B, a photoelectric conversion element and a resistor which are included in a photoelectric conversion device can be formed over one substrate with the same material and in the same process.

Thus, in a photoelectric conversion device, a mounting area can be reduced and yield can be improved. Further, in the photoelectric conversion device, the number of manufacturing processes and manufacturing cost can be reduced.

This application is based on Japanese Patent Application serial No. 2010-145401 filed with the Japan Patent Office on Jun. 25, 2010, the entire contents of which are hereby incorporated by reference.

What is claimed is:

1. A photoelectric conversion device comprising:
a photoelectric conversion element comprising a first p-type semiconductor layer, a first n-type semiconductor layer and a first intrinsic semiconductor layer between the first p-type semiconductor layer and the first n-type semiconductor layer, the photoelectric conversion element configured to output photocurrent corresponding to illuminance of an incident light with which the photoelectric conversion element is irradiated; and
a resistor comprising a second p-type semiconductor layer, a second n-type semiconductor layer and a second intrinsic semiconductor layer between the second p-type semiconductor layer and the second n-type semiconductor layer, the resistor configured to change resistance corresponding to illuminance of an incident light with which the resistor is irradiated,
wherein one end terminal of the photoelectric conversion element and one terminal of the resistor are electrically connected,
wherein the other terminal of the photoelectric conversion element is configured to be supplied with a high power supply potential, and
wherein the other terminal of the resistor is configured to be supplied with a low power supply potential.

2. The photoelectric conversion device according to claim 1, wherein a light intensity adjusting unit is provided on a light reception surface side of the photoelectric conversion element or the resistor.

3. The photoelectric conversion device according to claim 1, wherein the one terminal of the photoelectric conversion element and the one terminal of the resistor are electrically connected to an output voltage terminal.

4. The photoelectric conversion device according to claim 1, wherein the resistor is formed with amorphous silicon.

5. The photoelectric conversion device according to claim 1, wherein the photoelectric conversion element is a photodiode.

6. The photoelectric conversion device according to claim 1, wherein the photoelectric conversion element is a phototransistor.

7. The photoelectric conversion device according to claim 1,
wherein the first p-type semiconductor layer comprises the same material as the second p-type semiconductor layer,
wherein the first n-type semiconductor layer comprises the same material as the second n-type semiconductor layer, and
wherein the first intrinsic semiconductor layer comprises the same material as the second intrinsic semiconductor layer.

8. The photoelectric conversion device according to claim 5, wherein the photodiode is a PIN photodiode.

9. A photoelectric conversion device comprising:
a first electrode layer over a substrate;
a photoelectric conversion layer over the first electrode layer, wherein the photoelectric conversion layer is electrically connected to the first electrode layer;
a semiconductor layer over the substrate;
a second electrode layer over the photoelectric conversion layer and the semiconductor layer, wherein the second electrode layer is electrically connected to the photoelectric conversion layer and one end portion of the semiconductor layer; and
a third electrode layer electrically connected to the other end portion of the semiconductor layer,
wherein the semiconductor layer is formed of the same material and in the same process as the photoelectric conversion layer,
wherein the first electrode layer is configured to be supplied with a high power supply potential, and
wherein the third electrode layer is configured to be supplied with a low power supply potential.

10. The photoelectric conversion device according to claim 9, wherein the semiconductor layer is a variable resistor.

11. The photoelectric conversion device according to claim 9 further comprising:
an insulating layer, which covers the photoelectric conversion layer and the semiconductor layer,
wherein the second electrode layer and the third electrode layer are provided over the insulating layer.

12. The photoelectric conversion device according to claim 9, wherein each of the photoelectric conversion layer and the semiconductor layer comprises a p-type semiconductor layer, an n-type semiconductor layer, and an intrinsic semiconductor layer.

13. The photoelectric conversion device according to claim 9, wherein each of the photoelectric conversion layer and the semiconductor layer comprises a p-type semiconductor layer and an n-type semiconductor layer.

14. A photoelectric conversion device comprising:
  a gate electrode layer over a substrate;
  a gate insulating layer over the gate electrode layer;
  a photoelectric conversion layer over the gate electrode layer with the gate insulating layer interposed between the photoelectric conversion layer and the gate electrode layer;
  a semiconductor layer over the substrate;
  a first electrode layer over the photoelectric conversion layer and the semiconductor layer, wherein the first electrode layer is electrically connected to one end portion of the photoelectric conversion layer and one end portion of the semiconductor layer;
  a second electrode layer electrically connected to the other end portion of the photoelectric conversion layer;
  a third electrode layer electrically connected to the other end portion of the semiconductor layer,
  wherein the semiconductor layer is formed of the same material as the photoelectric conversion layer,
  wherein the second electrode layer is configured to be supplied with a high power supply potential, and
  wherein the third electrode layer is configured to be supplied with a low power supply potential.

15. The photoelectric conversion device according to claim 14, wherein the semiconductor layer is a variable resistor.

16. The photoelectric conversion device according to claim 14 further comprising:
  an insulating layer, which covers the photoelectric conversion layer and the semiconductor layer,
  wherein the first electrode layer, the second electrode layer and the third electrode layer are provided over the insulating layer.

17. The photoelectric conversion device according to claim 14, wherein each of the photoelectric conversion layer and the semiconductor layer comprises a p-type semiconductor layer, an n-type semiconductor layer, and an intrinsic semiconductor layer.

18. The photoelectric conversion device according to claim 14, wherein each of the photoelectric conversion layer and the semiconductor layer comprises a p-type semiconductor layer and an n-type semiconductor layer.

\* \* \* \* \*